US006834084B2

(12) United States Patent
Hietala

(10) Patent No.: US 6,834,084 B2
(45) Date of Patent: Dec. 21, 2004

(54) DIRECT DIGITAL POLAR MODULATOR

(76) Inventor: Alexander Wayne Hietala, 14017 S. 9th St., Phoenix, AZ (US) 85048

(*) Notice: Subject to any disclaimer, the term of this patent is extended or adjusted under 35 U.S.C. 154(b) by 289 days.

(21) Appl. No.: 10/139,560

(22) Filed: May 6, 2002

(65) Prior Publication Data

US 2003/0206056 A1 Nov. 6, 2003

(51) Int. Cl.[7] .............................................. H04L 25/49
(52) U.S. Cl. ....................................... 375/296; 332/100
(58) Field of Search ................................ 382/100, 145, 382/151, 149; 375/295, 296, 300, 308; 327/147–159; 331/177 R, 179, DIG. 2

(56) References Cited

U.S. PATENT DOCUMENTS

| 3,900,823 | A |   | 8/1975  | Sokal et al. ................. 330/149 |
| 4,609,881 | A |   | 9/1986  | Wells .......................... 331/1 A |
| 4,837,786 | A | * | 6/1989  | Gurantz et al. ............. 370/206 |
| 5,079,522 | A |   | 1/1992  | Owen et al. .................. 331/16 |
| 5,313,411 | A | * | 5/1994  | Tsujimoto .................... 708/322 |
| 5,430,416 | A |   | 7/1995  | Black et al. ................. 332/145 |
| 5,444,415 | A | * | 8/1995  | Dent et al. .................. 329/302 |
| 5,598,436 | A |   | 1/1997  | Brajal et al. ................ 375/297 |
| 5,822,011 | A | * | 10/1998 | Rumreich .................... 348/549 |
| 5,900,778 | A | * | 5/1999  | Stonick et al. .............. 330/149 |
| 5,952,895 | A |   | 9/1999  | McCune, Jr. et al. ........ 332/128 |
| 6,008,703 | A |   | 12/1999 | Perrott et al. ............... 332/100 |
| 6,101,224 | A | * | 8/2000  | Lindoff et al. .............. 375/300 |
| 6,211,747 | B1 |  | 4/2001  | Trichet et al. .............. 332/128 |
| 6,236,687 | B1 | * | 5/2001 | Caso et al. .................. 375/327 |
| 6,236,703 | B1 |  | 5/2001  | Riley .......................... 377/48 |
| 6,359,950 | B2 |  | 3/2002  | Gossmann et al. ......... 375/376 |
| 6,522,121 | B2 | * | 2/2003 | Coumou ................... 324/76.19 |
| 6,581,082 | B1 | * | 6/2003 | Opsahl ....................... 708/443 |

OTHER PUBLICATIONS

Volder, Jack E., "The CORDIC Trigonometric Computing Technique," IRE Trans. On Elect. Computers p. 330, Sep. 1959.

* cited by examiner

*Primary Examiner*—Timothy P. Callahan
*Assistant Examiner*—Cassandra Cox
(74) *Attorney, Agent, or Firm*—Withrow & Terranova, PLLC

(57) ABSTRACT

A polar modulator creates an amplitude signal and a frequency signal and digitally adjusts the signals so that the frequency and amplitude signals arrive at the power amplifier at the appropriate times. A digital predistortion filter is applied to the frequency signal. The frequency signal is then provided to a single port of a fractional N divider in a phase locked loop. The output of the phase locked loop drives an input of the power amplifier while the amplitude signal is converted to an analog signal and controls the power supply input of the power amplifier.

17 Claims, 3 Drawing Sheets

DIRECT DIGITAL POLAR MODULATOR

FIELD OF THE INVENTION

The present invention relates to a transmitter and particularly to a polar modulator in a transmitter.

BACKGROUND OF THE INVENTION

Transmitters typically contain some sort of baseband processing, followed by a modulator, an amplifier, and an antenna that transmits signals to remote locations. With the proliferation of mobile terminals and wireless LANs, transmitters are becoming more and more common.

In transmitters using linear modulation schemes, the traditional method of realizing the transmit signal has been to use a quadrature modulator to create a signal containing both amplitude and phase components. This signal is then amplified by the amplifier to create the final output signal that passes to the antenna.

The problem with the traditional approach is that it requires a linear power amplifier, which is not as efficient as a non-linear power amplifier operating in saturation. Further, the quadrature modulator must draw significant current to make noise specifications without additional filtering. Still further, the transmit path is not compatible with newer, more efficient GSM transmit methodologies. For example, while a non-linear amplifier might work with a Gaussian minimum-shift keying (GMSK) mode, it would not work with an Enhanced Data Rates for GSM Evolution (EDGE) mode. This hinders the ability to use such approaches in multimode mobile terminals.

One alternative to the quadrature approach is the use of a polar modulator where phase information is passed through a non-linear power amplifier, and the amplitude signal is applied to the power amplifier by a second path. Such polar modulators have problems as well. Specifically, it is difficult to cause the amplitude and phase signals to arrive at the power amplifier at the same time. This is especially true in the analog systems used to date for polar modulated transmitters. Analog components not only have time delays that vary between the paths as a function of the number of components, but also vary as a result of manufacturing tolerances. Thus, no standard time alignment can be used for a transmitter. Instead, each transmitter must have a customized time alignment device, or the tolerances must be so precise that it becomes uneconomical for production. Most polar modulators also still have a quadrature modulator with its attendant current drain.

Thus, there remains a need for better modulators in transmitters.

SUMMARY OF THE INVENTION

The present invention uses a polar converter within a polar modulator to create an amplitude signal and a frequency signal, and digitally adjusts the signals so that the frequency and amplitude signals arrive at a power amplifier at the appropriate times. A digital predistortion filter is applied to the frequency signal. The frequency signal is then provided to a single port of a fractional N divider in a phase locked loop. The output of the phase locked loop drives an input of the power amplifier. Meanwhile, the amplitude signal is converted to an analog signal and controls the power supply input of the power amplifier.

In particular, the data representing the signal to be transmitted is received and mapped onto I and Q components. Each I and Q component is filtered and converted to frequency and amplitude signals in a polar coordinate system. The signals are adjusted in amplitude and time. The amplitude signal is converted to an analog signal and ramped up for use at the power amplifier. The frequency signal is digitally filtered and digitally predistorted before being introduced into a fractional N divider of a phase locked loop. The output of the phase locked loop drives the power amplifier.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
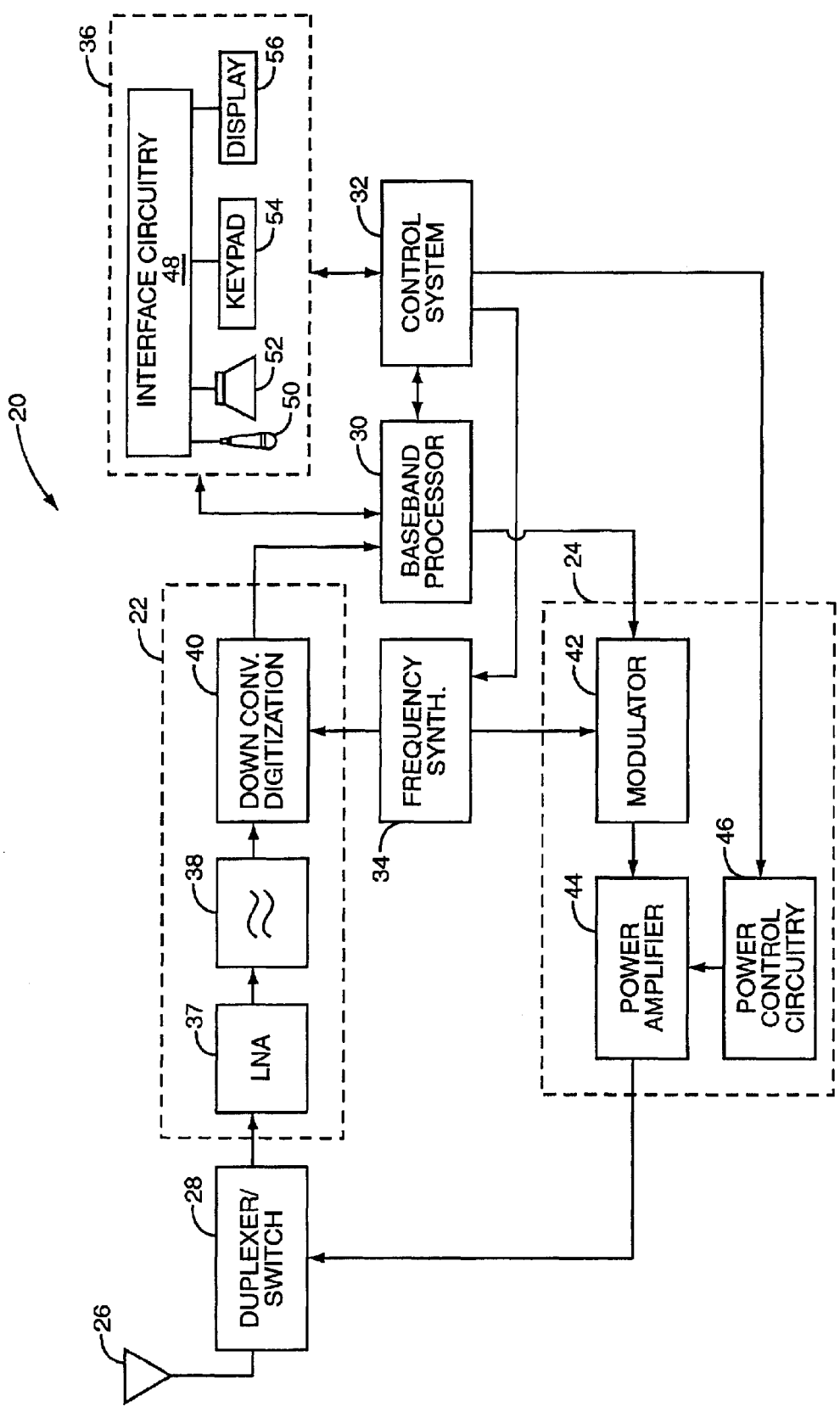
FIG. 1 illustrates a mobile terminal such as may use the present invention.

The present invention is preferably incorporated in a mobile terminal 20, such as a mobile telephone, personal digital assistant, or the like. The basic architecture of a mobile terminal 20 is represented in FIG. 1, and may include a receiver front end 22, a radio frequency transmitter section 24, an antenna 26, a duplexer or switch 28, a baseband processor 30, a control system 32, a frequency synthesizer 34, and an interface 36. The receiver front end 22 receives information bearing radio frequency signals from one or more remote transmitters provided by a base station (not shown). A low noise amplifier 37 amplifies the signal. A filter circuit 38 minimizes broadband interference in the received signal, while a downconverter 40 downconverts the filtered, received signal to an intermediate or baseband frequency signal, which is then digitized into one or more digital streams. The receiver front end 22 typically uses one or more mixing frequencies generated by the frequency synthesizer 34.

The baseband processor 30 processes the digitized, received signal to extract the information or data bits conveyed in the received signal. This processing typically comprises demodulation, decoding, and error correction operations. As such, the baseband processor 30 is generally implemented in one or more digital signal processors (DSPs).

On the transmit side, the baseband processor 30 receives digitized data from the control system 32, which it encodes for transmission. The encoded data is output to the radio frequency transmitter section 24, where it is used by a modulator 42 to modulate a carrier signal that is at a desired transmit frequency. Power amplifier 44 amplifies the modulated carrier signal to a level appropriate for transmission from the antenna 26.

As described in further detail below, the power amplifier 44 provides gain for the signal to be transmitted under control of the power control circuitry 46, which is preferably controlled by the control system 32.

A user may interact with the mobile terminal 20 via the interface 36, which may include interface circuitry 48 associated with a microphone 50, a speaker 52, a keypad 54, and a display 56. The interface circuitry 48 typically includes analog-to-digital converters, digital-to-analog converters, amplifiers, and the like. Additionally, it may include a voice encoder/decoder, in which case it may communicate directly with the baseband processor 30.

The microphone 50 will typically convert audio input, such as the user's voice, into an electrical signal, which is then digitized and passed directly or indirectly to the baseband processor 30. Audio information encoded in the received signal is recovered by the baseband processor 30, and converted into an analog signal suitable for driving speaker 52 by the interface circuitry 48. The keypad 54 and display 56 enable the user to interact with the mobile terminal 20, input numbers to be dialed and address book information, or the like, as well as monitor call progress information.

While the present invention is well-suited for incorporation into a mobile terminal, such as the mobile terminal 20 just described, the present invention is also well-suited for use in wireless transmitters associated with wireless LANs and the like. As such, the present invention is not limited to a particular apparatus.

Figure 2:
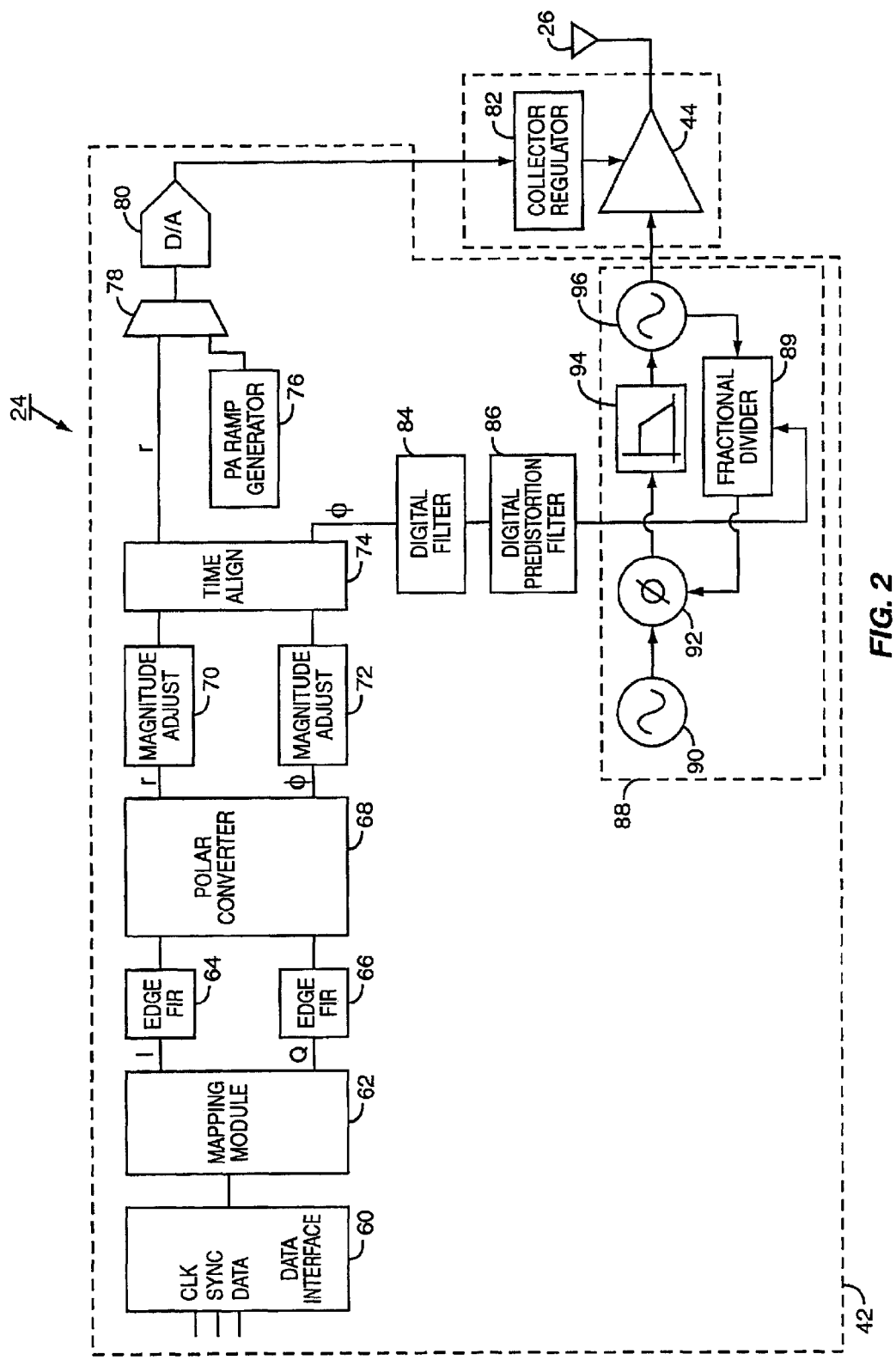
FIG. 2 illustrates a transmit chain according to an exemplary embodiment of the present invention.

The present invention may be situated in the modulator 42 as illustrated in FIG. 2. Specifically, the modulator 42 may comprise several components, including, a serial interface 60, a mapping module 62, first and second filters 64, 66, a polar converter 68, magnitude adjusters 70, 72, and a time aligner 74. Other components of the modulator 42 will be discussed below.

The serial interface 60 receives Non-Return to Zero (NRZ) serial data from the baseband processor 30 at the bit rate of the system. NRZ data may be a 1B1B code with one line bit for each associated binary bit. In an exemplary embodiment, the modulation scheme for the modulator 42 is an Enhanced Data Rates for GSM Evolution (EDGE) modulation scheme and thus, the bit rate is 812.5 kbps. This data is passed to the mapping module 62, where the data is grouped into symbols of three consecutive data bits, Grey coded, and rotated by $3\pi/8$ on each symbol as per European Telecommunications Standards Institute (ETSI) specifications. The resulting symbol is mapped to one of sixteen points in an I,Q constellation.

Both the I and the Q components for each point are then filtered by the first and second filters 64, 66 respectively. In an exemplary embodiment, the first and second filters 64, 66 are EDGE finite impulse response (FIR) filters. The filters, as dictated by the ETSI specifications, shape the response between symbol times.

After filtering, both the I and the Q components are sent to the polar converter 68 where they are converted into frequency ($\phi$) and amplitude (r) equivalent signals by use of a classical CORDIC (coordinate rotation digital computer). The polar converter 68 also includes a conversion from a true phase signal to a frequency signal. This conversion is well understood in the art and for the purposes of the present invention, this conversion is treated as part of the CORDIC conversion. Further information about CORDIC algorithms may be found in *Proceedings of the* 1998 *ACM/SIGDA Sixth International Symposium On Field Programmable Gate Arrays* by Ray Andraka, February 22–24, pp.191–200 and "The CORDIC Trigonometric Computing Technique" by Jack E. Volder *IRE Trans on Elect. Computers*, p.330, 1959, both of which are hereby incorporated by reference in their entirety.

Magnitude adjusters 70, 72 then adjust the magnitude of the r and $\phi$ signals respectively to balance the paths such that they comply with the appropriate standard. Further, a relative time delay is applied to the signals for best Error Vector Magnitude (EVM) and spectrum by the time aligner 74.

At this point the r (amplitude) and $\phi$ (frequency) signals separate and proceed by different paths, an amplitude signal processing path and a frequency signal processing path, respectively, to the power amplifier 44. With respect to the amplitude signal processing path, a power ramping function is added by the PA ramp generator 76 by a multiplier 78. The combined signal is then converted to an analog signal by D/A converter 80. The output of the D/A converter 80 is used to set the collector voltage on the power amplifier 44 through a collector regulator 82. As the amplitude signal changes, the voltage at the power amplifier 44 collector changes and the output power will vary as $V^2/R_{out}$ ($R_{out}$ is not shown, but is effectively the load on the power amplifier 44). This is sometimes known as "plate modulation".

The $\phi$ signal, however, is initially digitally low pass filtered by digital filter 84 and then predistorted by digital predistortion filter 86 before being provided to a fractional N phase locked loop (PLL) 88. In this exemplary embodiment, the signal is applied to a single port on the fractional N divider 89. The digital predistortion filter 86 has approximately the inverse of the transfer function of the PLL 88. For more information about the digital predistortion filter 86, the interested reader is referred to U.S. Pat. No. 6,008,703, which is hereby incorporated by reference in its entirety.

The fractional N PLL 88 has a bandwidth associated therewith. The digital predistortion filter 86 is preferably formed so as to account for this bandwidth. Further, the bandwidth of the fractional N PLL 88 may be calibrated in front of each burst so that the predistortion lines up with the fractional N PLL 88.

In general, the fractional N PLL 88 comprises a reference source 90 that is fed to a phase comparator 92. The phase comparator 92 compares the edges of the reference source 90 to the output of the fractional N divider 89 and produces a correction signal. The correction signal is low pass filtered by filter 94 and input to a voltage controlled oscillator (VCO) 96. The output of the VCO 96 outputs a frequency modulated signal at the RF carrier, which in turn is applied as the signal input of the power amplifier 44 and is also fed back to the fractional N divider 89. The divisor of the fractional N divider 89 is modulated by the distorted $\phi$ signal from the digital predistortion filter 86. Further information on fractional N PLLs, how to modulate a signal by varying the fractional N divider 89, and the like may be found in U.S. Pat. Nos. 6,359,950; 6,236,703; 6,211,747; 5,079,522; 5,055,802; and 4,609,881, which are hereby incorporated by reference in their entireties.

It should be appreciated that the fractional N PLL 88 may be replaced with an integer PLL with a translational offset and a wideband digital modulator (neither shown). Antenna 26 then emits electromagnetic radiation corresponding to the output of the power amplifier 44.

By using digital components until just prior to the power amplifier 44, the concerns about the signals arriving at the appropriate times are minimized. This allows the time aligner 74 to provide the appropriate time shift without customization for each analog component.

Figure 3:
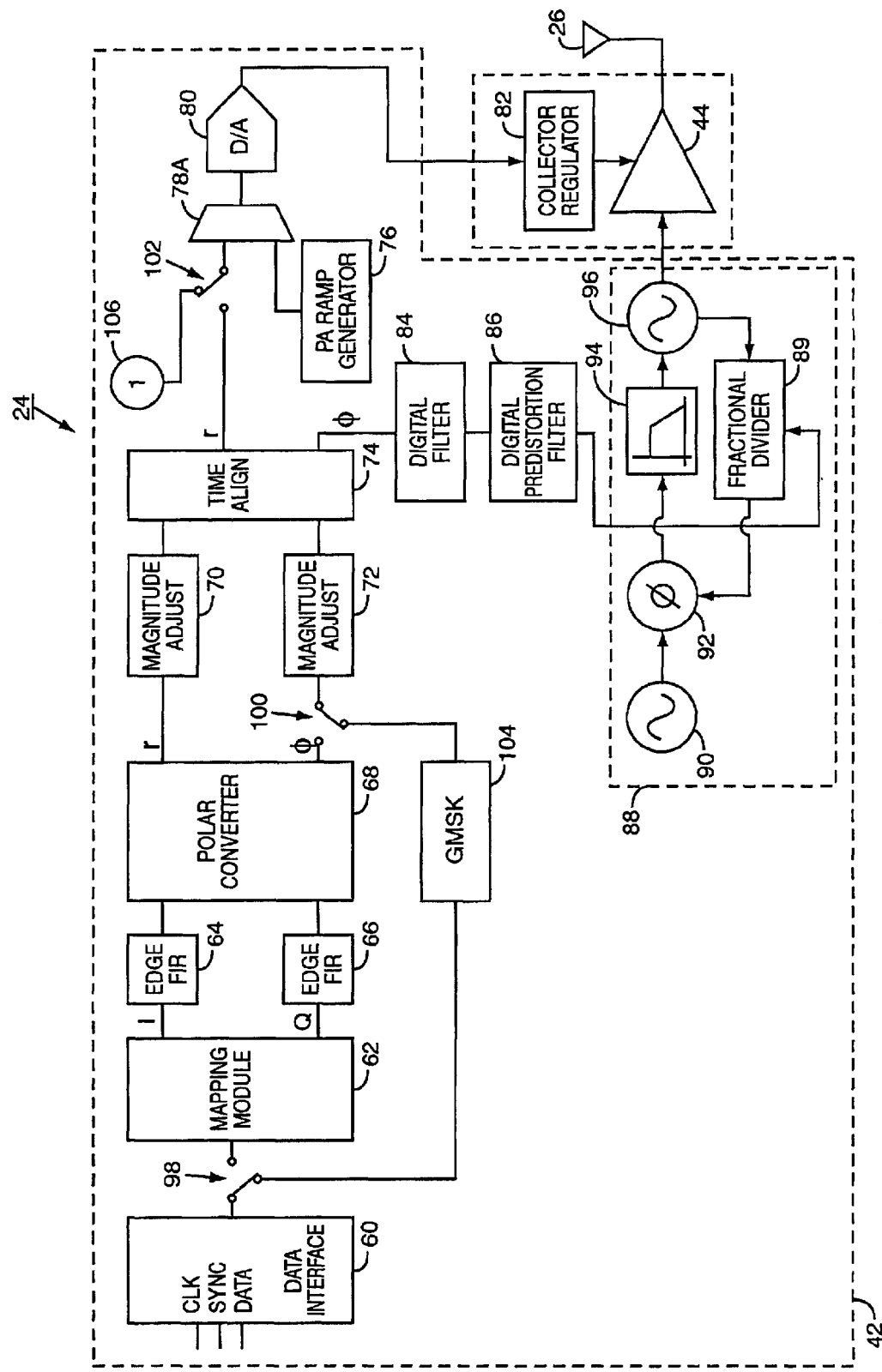
FIG. 3 illustrates an alternate dual-mode embodiment of the present invention.

In the alternate embodiment of FIG. 3, the modulator 42 may switch between EDGE and Gaussian minimum-shift keying (GMSK) modes. Switches 98, 100, and 102 operate in tandem to switch out the polar modulator components and switch in the GMSK processing components. As used herein, the switches 98, 100, and 102 may be any appropriate switching technology such as a transistor switching, a mapping function, or the like, as needed or desired. Specifically, switch 98 takes out the mapping module 62, the filters 64, 66, and the polar converter 68. Instead, the NRZ signal is passed to conventional GMSK processing circuitry 104 and a frequency signal is generated thereby. Exemplary GMSK processing circuitry is discussed in U.S. Pat. No. 5,825,257, which is hereby incorporated by reference in its entirety. It should be appreciated that other GMSK processing circuitry may also be used and the particular circuitry is not central to the present invention. This frequency signal is magnitude adjusted by magnitude adjuster 72 and aligned in time by time aligner 74. The frequency signal is then filtered and predistorted as previously described before being introduced to fractional divider 89 of the fractional N PLL 88. The amplitude signal is set at unity by the step function generator 106, and switch 102 introduces this signal to a multiplier 78A. The multiplier 78A multiplies the amplitude signal by the ramp function, and the output is converted by the D/A 80 for controlling the power supply of the power amplifier 44.

Those skilled in the art will recognize improvements and modifications to the preferred embodiments of the present invention. All such improvements and modifications are considered within the scope of the concepts disclosed herein and the claims that follow.

What is claimed is:

1. A modulator circuit comprising:
   a polar converter adapted to generate a digital frequency signal and a digital amplitude signal from an incoming signal;
   a digital predistortion filter adapted to filter the digital frequency signal from the polar converter; and
   a phase locked loop comprising a divider adapted to receive an output from said digital predistortion filter, said phase locked loop generating an output adapted to comprise an input for a power amplifier.

2. The modulator circuit of claim 1 further comprising a mapping module adapted to receive an incoming bit stream and map the incoming bit stream to I and Q components to provide the incoming signal.

3. The modulator circuit of claim 1 further comprising an amplitude processing path adapted to provide a signal for controlling a power supply of the power amplifier.

4. The modulator circuit of claim 3 wherein said amplitude processing path comprises a ramp generator.

5. The modulator circuit of claim 1 wherein said phase locked loop comprises a first transfer function and said digital predistortion filter comprises a second transfer function approximately the inverse of the first transfer function.

6. The modulator circuit of claim 2 further comprising a digital interface adapted to accept a bit stream of data in an NRZ bit stream format and passing said bit stream to said mapping module.

7. The modulator circuit of claim 1 further comprising GMSK processing circuitry and at least one switch to switch between said GMSK processing circuitry and said polar modulator.

8. The modulator circuit of claim 1 further comprising a switch for switching between EDGE processing and GMSK processing in the modulator circuit.

9. The modulator circuit of claim 1 wherein said divider comprises a fractional N divider.

10. A method of modulating a signal prior to transmission, comprising:
    mapping a bit stream to I and Q components;
    converting the I and Q components to a frequency signal and an amplitude signal;
    digitally predistorting the frequency signal with a first transfer function to create a distorted frequency signal;
    passing the distorted frequency signal to a divider in a phase locked loop to create an input signal, said phase locked loop having a second transfer function, said first transfer function being approximately the inverse of the second transfer function; and
    passing the amplitude and input signal to a power amplifier for transmission.

11. The method of claim 10 further comprising receiving a bit stream.

12. The method of claim 10 further comprising filtering the I and Q components.

13. The method of claim 10 wherein converting the I and Q components to frequency and amplitude signals comprises converting the components using a CORDIC algorithm.

14. The method of claim 10 further comprising filtering the frequency signal prior to digitally predistorting the frequency signal.

15. The method of claim 10 wherein passing the distorted frequency signal to a divider in a phase locked loop to create an input signal comprises passing the distorted frequency signal to a fractional N divider in a phase locked loop.

16. The method of claim 10 further comprising switching out circuitry adapted for use with EDGE modulation and switching in circuitry adapted for use with GMSK modulation.

17. A hardware implemented modulator circuit comprising:
    a switch adapted to switch the modulator circuit between a GMSK mode and an EDGE mode;
    a serial data interface adapted to receive a bit stream of data representing a signal to be transmitted and output the same;
    a GMSK modulator adapted to receive the bit stream of data when in said GMSK mode;
    a polar modulator adapted to receive the bit stream of data when in said EDGE mode and comprising:
        a mapping module adapted to map the bit stream of data onto I and Q components; and
        a polar converter adapted to convert the I and Q components into frequency and amplitude signals;
    a digital predistortion filter imposing a first transfer function on a frequency signal received from either said polar converter or said GMSK modulator;
    a phase locked loop having a second transfer function, said first transfer function being approximately the inverse of said second transfer function, said phase locked loop comprising a fractional N divider, said fractional N divider receiving an output from said digital predistortion filter; and a power amplifier receiving an amplitude signal and the output of the phase locked loop.

* * * * *

UNITED STATES PATENT AND TRADEMARK OFFICE
CERTIFICATE OF CORRECTION

PATENT NO. : 6,834,084 B2  Page 1 of 1
APPLICATION NO. : 10/139560
DATED : December 21, 2004
INVENTOR(S) : Alexander Wayne Hietala It is certified that error appears in the above-identified patent and that said Letters Patent is hereby corrected as shown below:

Title page,
Item [73] Assignee, please add as follows: -- Assignee: RF Micro Devices, Inc., Greensboro, NC (US) --

Signed and Sealed this

Twentieth Day of May, 2008

JON W. DUDAS
*Director of the United States Patent and Trademark Office*